United States Patent [19]
Claverie et al.

[11] Patent Number: 5,903,187
[45] Date of Patent: May 11, 1999

[54] MONOLITHICALLY INTEGRABLE FREQUENCY DEMODULATOR DEVICE

[75] Inventors: Claude Claverie, Rennes; Xavier Guitton, Montgermont, both of France

[73] Assignee: Thomson Broadcast Systems, Cergy-Saint-Christophe, France

[21] Appl. No.: 08/777,044

[22] Filed: Dec. 30, 1996

[30] Foreign Application Priority Data

Dec. 29, 1995 [FR] France .................................. 95 15746

[51] Int. Cl.⁶ ........................................................ H03D 3/04
[52] U.S. Cl. ............................. 329/342; 329/343; 455/214
[58] Field of Search .................................. 329/341, 342, 329/343; 455/214

[56] References Cited

U.S. PATENT DOCUMENTS

| | | | |
|---|---|---|---|
| 3,594,588 | 7/1971 | Evans et al. .............................. | 327/49 |
| 3,824,410 | 7/1974 | Funaki et al. ............................. | 331/18 |
| 4,280,100 | 7/1981 | Dann ........................................ | 329/327 |
| 4,350,957 | 9/1982 | Miyamoto ................................ | 329/342 |
| 4,800,338 | 1/1989 | Yoshizawa et al. ..................... | 329/342 |

Primary Examiner—Siegfried H. Grimm
Attorney, Agent, or Firm—Oblon, Spivak, McClelland, Maier & Neustadt, P.C.

[57] ABSTRACT

Frequency modulated signals are demodulated through a limiter circuit that chops the signal to give pulses whose occurrence frequency is proportional to the instant frequency of the received signal. The invention is devoted to a new processing of those pulses. The leading edges of the pulses are time integrated. The obtained signal is then as usual, low pass filtered to give the demodulated signal. The main advantage of this new processing is that the circuit that makes this processing does not implement delay lines and can then be made as a single chips.

26 Claims, 5 Drawing Sheets

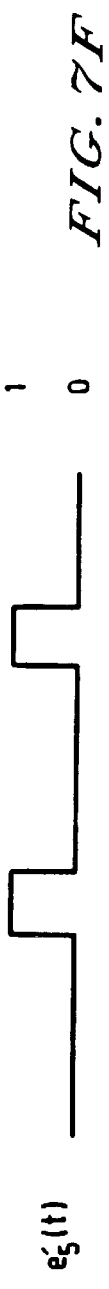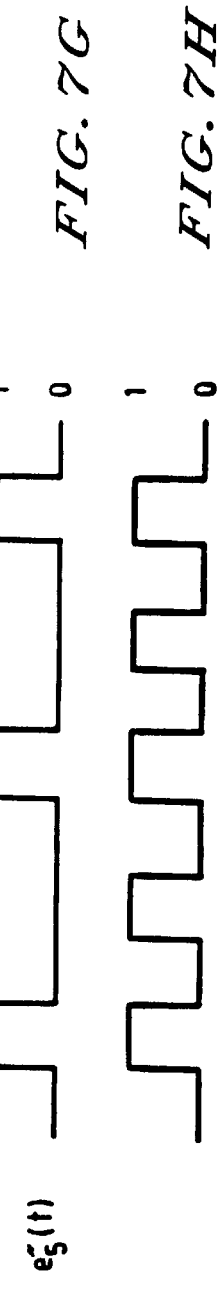

MONOLITHICALLY INTEGRABLE FREQUENCY DEMODULATOR DEVICE

FIELD OF THE INVENTION

The invention lies in the field of frequency demodulators.

1. Background of the Invention

It is known that in order to demodulate a frequency-modulated wave, it suffices to generate, from this wave, pulses having the same specified duration independent of the frequency of the waves and a frequency of occurrence proportional to this frequency, and then to integrate these pulses to obtain a level proportional to the frequency to be demodulated.

2. Description of the Prior Art

Many devices make it possible to carry out this function: one of them represented in FIG. 1 uses a limiter circuit 1 arranged in series with a monostable latch 2 and a low-pass filter 3. The limiter circuit 1 clips the frequency-modulated signal; it thus delivers signals characterized by two amplitude levels O/E on the basis of which the monostable latch 2 delivers pulses of duration $\tau = C^{st}$ of variable recurrence frequency, from which the low-pass filter 3 extracts the mean value. By virtue of the performance of available monostables, this solution is limited to a maximum correct operating frequency $\leq 10$ Mhz, this being manifestly insufficient to convey VIDEO signals.

Represented in FIG. 1 are, in addition to the three blocks 1, 2 and 3 representing the limiter 1, the monostable latch 2 and the low-pass filter 3, the wave forms present at the input and output of each of the circuits. The instantaneous mean value of an electrical quantity, $A_0$, for example a voltage or a current obtained at the output of the low-pass filter 3, is equal to:

$$A_0 = E\tau f \text{ or } A_0 = l.\tau.f$$

In these expressions, E and l are the predetermined values of the electrical quantities and f is the instantaneous value of the frequency of the frequency-modulated wave which it is wished to demodulate.

It should be pointed out at this juncture that the instantaneous mean value of a signal is the quotient of the integral of the amplitude of the signal over time, and the signal integration time. For a periodic signal, this value is expressed by the expression:

$$\frac{1}{T}\int_0^T f(t)dt$$

in which T is the instantaneous period of the signal and f(t) the amplitude of the signal as a function of time, measured between the instants O and T.

A second known device uses a limiter with two outputs. A delay line, generating a delay $\tau$, is inserted into one of the outputs of the limiter stage. An "EXCLUSIVE OR" circuit (or a mixer stage) receives the output from the limiter on one of its inputs and the delayed output on the other. This circuit next feeds a low-pass filter. The combinatorial logic operation performed by the "EXCLUSIVE OR" circuit takes the form of the production of pulses of duration $\tau = C^{st}$ and also of a very beneficial phenomenon of doubling of the frequency of recurrence of the pulses, facilitating the calculation of the mean value performed by the low-pass filter. Inasmuch as the delay line is of high performance—delay line constructed from coaxial cables or microstrip lines—it is possible by additionally taking stringent precautions in the processing of the pulses to construct high-performance frequency demodulators, but such a solution is poorly suited to monolithic integration, in particular for low frequencies.

For high frequencies of the order of 100 MHz, a solution in which the delay line is constructed in a form which can be integrated into an ASIC is known from an article entitled "High-performance integrated receiver circuit for optical fiber transmission of wideband FM video signals", by L. P. de Jong and CMCJ Hooghiemstra, published in IEE Transaction on Consumer Electronics, volume CE-33 No. 3, August 1987.

The construction of such a delay line is described in paragraph 3.3 of that article in conjunction with FIG. 4 of that article. Basically, a plurality of circuits such as that represented in FIG. 4 of that article are connected in series. Each circuit yields a delay $\tau_0$ so that the total delay $\tau$ is equal to $n\tau_0$, n representing the number of circuits.

Such a construction is beneficial inasmuch as it can be embodied in monolithic fashion but it is noted immediately that the delay $\tau$ is predetermined by the number of elementary circuits wired in series and it cannot be varied on demand. According to the invention on the other hand the value of $\tau$ can be adjusted in practice so as to reach $$\frac{T\min}{2}$$

Tmin is the period of the highest frequency obtained through the modulation. This characteristic makes the invention particularly beneficial in respect of broadband signals including in particular low frequencies. It was seen above that the value of $A_0$ is given by the relation $A_0 = E\tau f$, in which $\tau$ is the delay, E is the amplitude of the pulses produced, for example by the monostable circuit, and f is the instantaneous frequency. The value of $A_0$ therefore ranges between two values $A_1 = E\tau fmin$ and $A_2 = E\tau fmax$. The dynamic range of $A_0$ is therefore equal to $A_2 - A_1 = E\tau(fmax - fmin)$. At the low carrier frequencies, the difference between fmax and fmin, which is an increasing function of the carrier frequency, decreases. By contrast the value of $\tau$, which according to the invention can attain $$\frac{T\min}{2}$$

i.e. $\frac{1}{2f\max}$ can increase to the point at which it compensates for the decrease of $\Delta A_0 = A_2 - A_1$ due to the drop in the value of the carrier frequency.

The present invention is aimed, like the construction described in the aforesaid article, at a frequency demodulator circuit which can be integrated into a dedicated integrated circuit. The circuit according to the invention operates according to the principle of demodulation in which a delay line and an "EXCLUSIVE OR" circuit are used. However, according to the invention, a mathematical equivalent of the delay $\tau$ is produced, but without a delay line being used.

The invention stems from the observation that in the expression for the coefficient $A_0 = E\tau f$, the coefficient $\tau$ has the dimension of a time. Consequently, any signal which may be produced, and whose mean value is proportional to frequency, can be used to demodulate a frequency-modulated signal. According to the invention, such an initial demodulation signal is obtained by integrating over time the rising edges of the pulses output by the limiter. This integration is performed according to the formula $$A_0 = \frac{E}{T}\int f(t)dt = \frac{E}{T}\left[\int_0^\tau \frac{t}{\tau}dt + \int_\tau^{T/2} dt\right]$$

i.e. $A_0 = E\left(\frac{1}{2} - \frac{\tau}{2T}\right) = \frac{E}{2}(1 - \tau f)$.

In these expressions, t represents the time elapsed starting from each of the pulse edges, e.g. the rising edges. Thus, according to the invention, a circuit is used which uses the edges of the pulses output by the limiter, these edges having the amplitude E, to carry out asymmetric integration of the signal present at the output of the limiter.

SUMMARY OF THE INVENTION

Thus, the invention relates to a circuit of a demodulator of a frequency-modulated signal, the instantaneous frequency of the signal varying between a minimum frequency fmin and a maximum frequency fmax, the circuit having at least one input receiving an input signal formed by a train of pulses, each pulse having a rising edge and a falling edge, the height of a pulse of the input signal being equal to the difference between the level of the signal before a rising or falling edge and its level after this rising or falling edge, the circuit producing on an output of the circuit a signal whose instantaneous integral over time has a value proportional to the instantaneous frequency of the pulses making up the input signal, the circuit being characterized in that it carries out integration over time of the height of at least one of the edges of each pulse of the input signal of the circuit.

In one of the embodiments which will be described below with reference to FIG. 4, at least one circuit is used in which the integration over the pulse edge is obtained through linear charging of a capacitance. The time τ of charging of the capacitance is then a coefficient of proportionality between the instantaneous value of the signal output by the low-pass filter and the instantaneous frequency of the modulated signal. In this embodiment, in addition to the circuit according to the invention, there is preferably used a pulse generator circuit receiving the integrated signal output by the circuit according to this first embodiment of the invention and transforming this signal into a train of square pulses all having the same width and the frequency of which is equal to or a multiple of the frequency of the modulated wave.

This embodiment has the advantage of being able to use circuits which are well known in the prior art. It also enables the pulses to be calibrated in such a way as to circumvent for example amplitude drifting due to temperature variations.

In the preferred embodiment which will be described below with reference to FIG. 6, two circuits according to the invention are used in such a way as to benefit from the pulse frequency doubling effect.

BRIEF DESCRIPTION OF THE DRAWINGS

The most general embodiment of the invention, various embodiments thereof, and a preferred embodiment will be described hereafter and their manner of operation explained, by way of purely non-limiting example, in association with the appended drawings in which.

Curve 3A represents the form of a signal $e_1(t)$ present at the input of a limiter circuit which is the input circuit of a demodulator.

Curve 3B represents the form of the signal $e_2(t)$ which is the transform of the signal $e_1(t)$ by the limiter circuit.

Curve 3C represents the form of a signal $e_4(t)$ present at the output of an asymmetric integrator circuit according to the invention, this circuit receiving as input the signal $e_2(t)$ present at the output of a limiter circuit.

Figure 4:
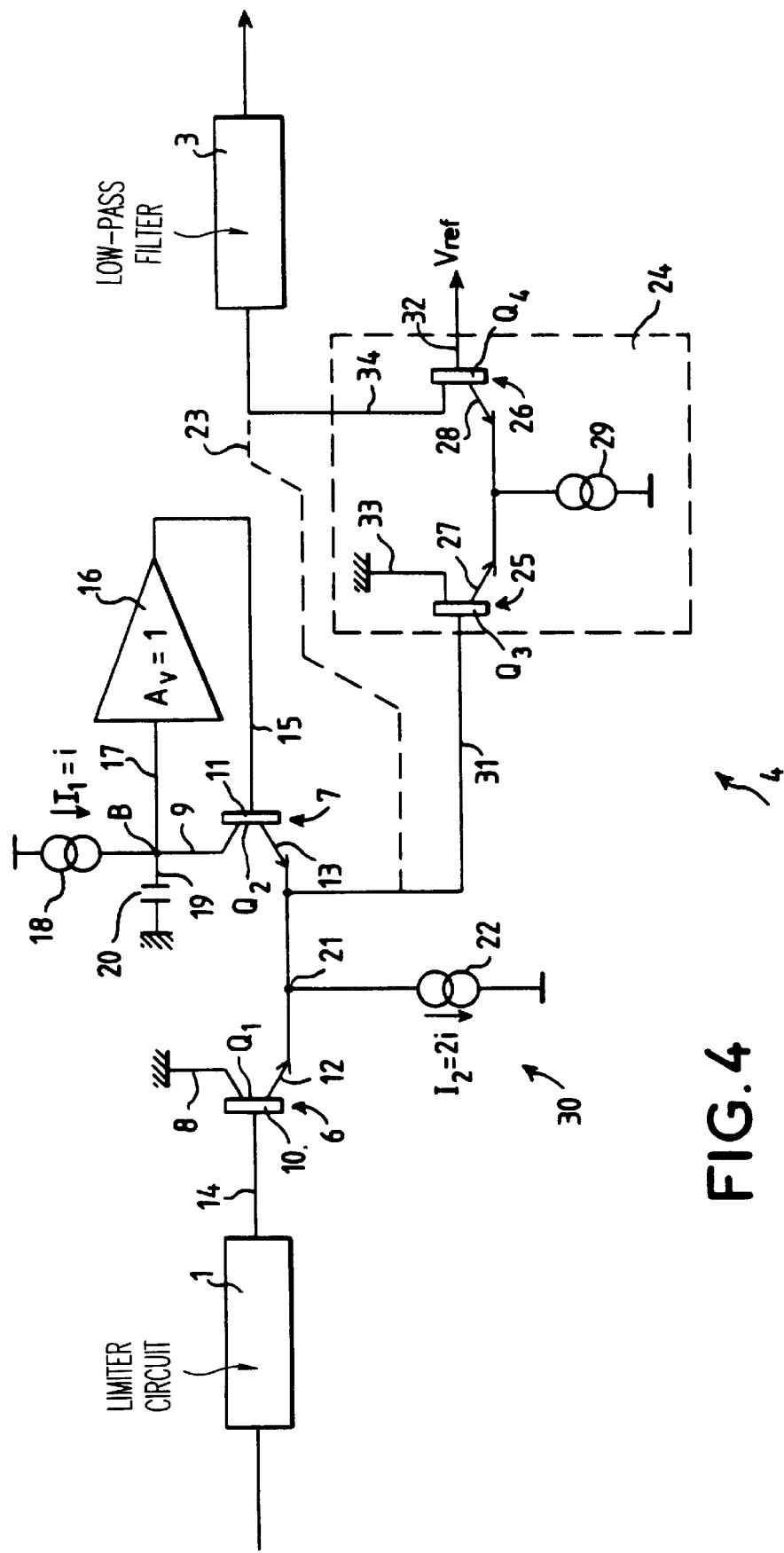

FIG. 4 represents a first embodiment of a circuit carrying out asymmetric integration of a pulse edge present at the output of the limiter circuit as well as an advantageous variant thereof.

Figure 5:
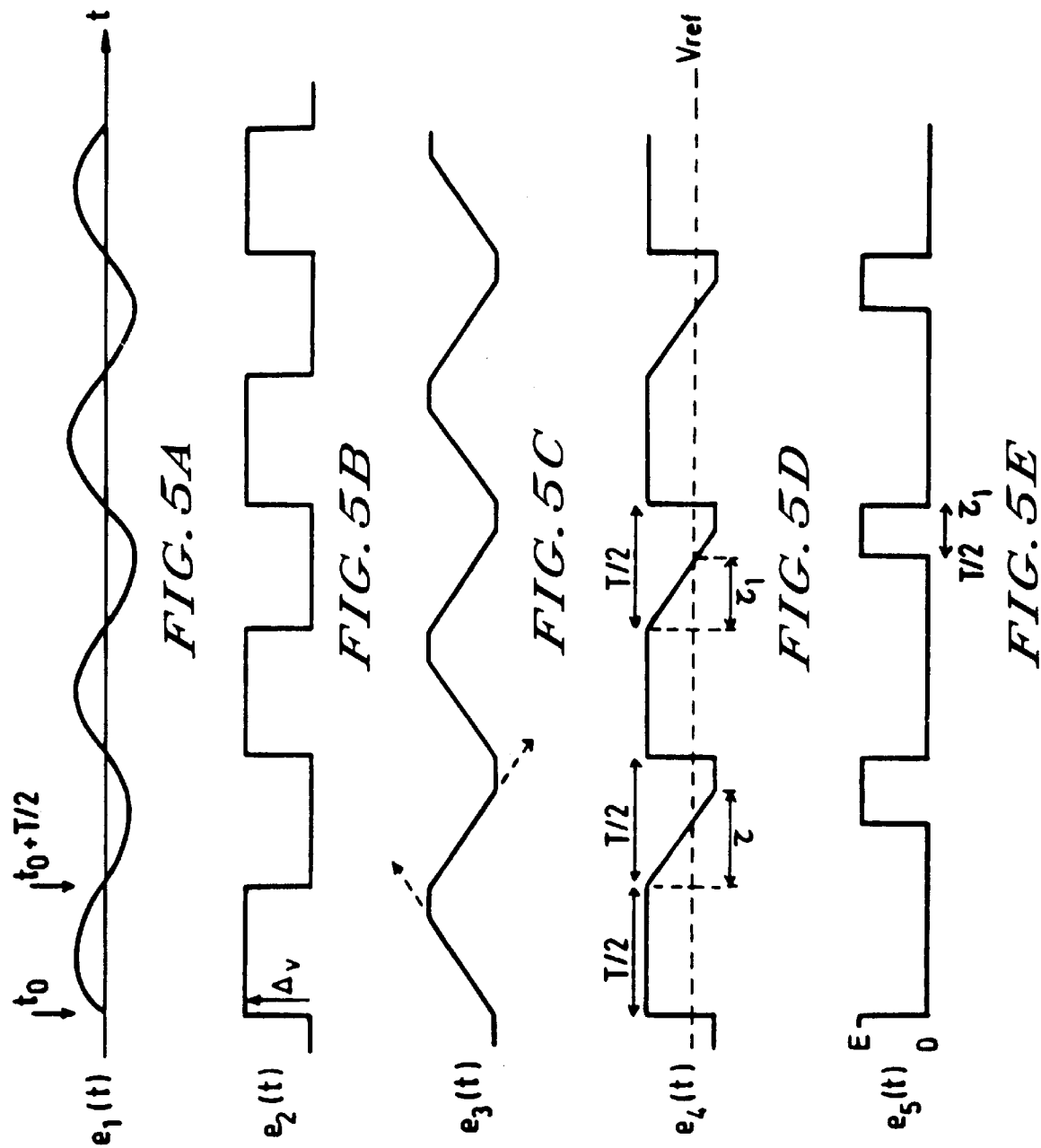

FIGS. 5A to 5E are curves representing on the same time scale:

In the case of FIG. 5A, the form of a wave to be demodulated, present at the input of the limiter circuit.

In the case of FIG. 5B, a train of pulses of variable durations present at the output of the limiter circuit.

In the case of FIG. 5C, the form of a signal present at a point of the circuit described by FIG. 4.

In the case of FIG. 5D, the form of a signal at the output of the circuit according to the first embodiment described in conjunction with FIG. 4.

In the case of FIG. 5E, the form of a signal at the output of a circuit according to the advantageous variant described in conjunction with FIG. 4.

Figure 6:
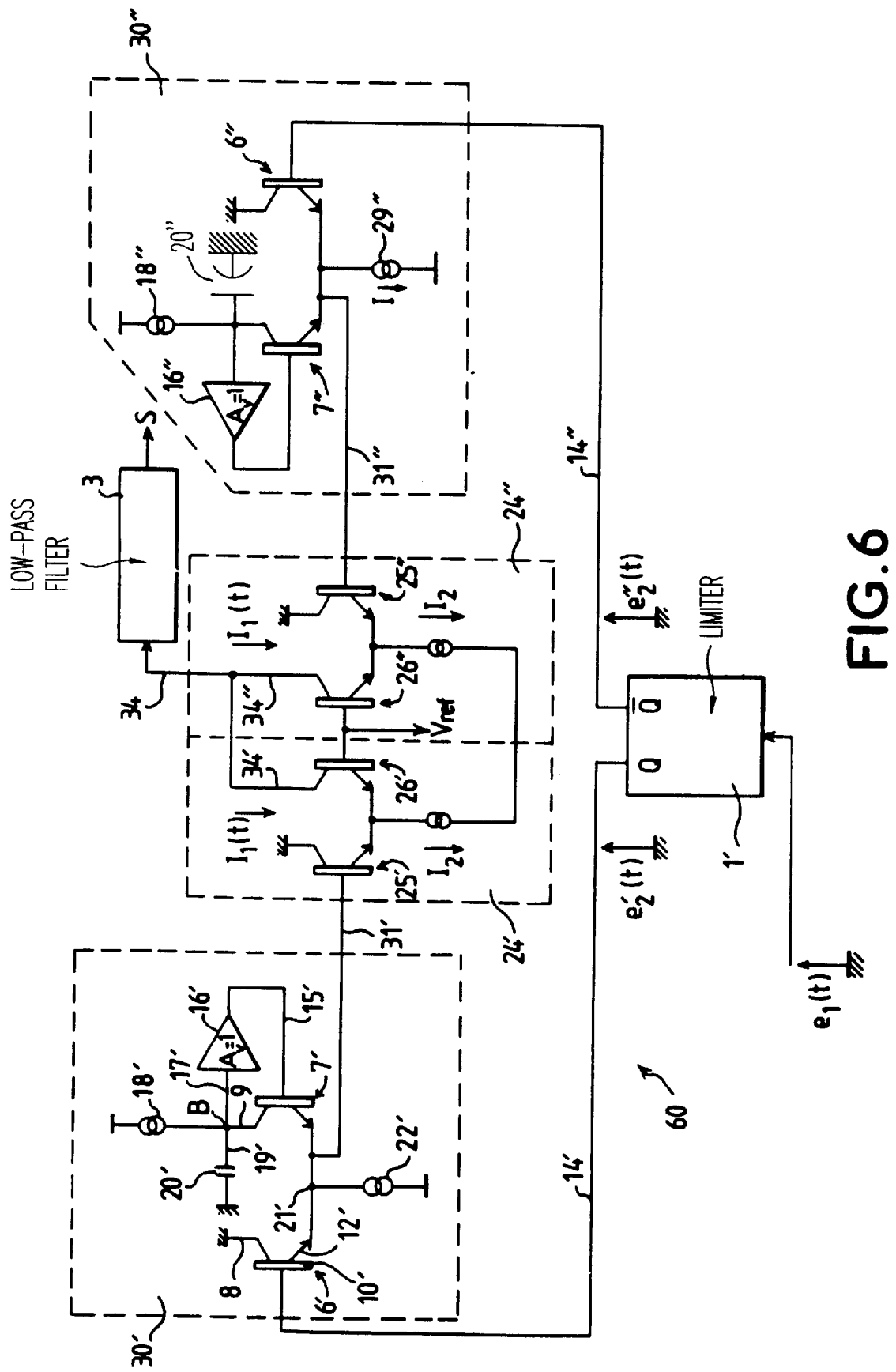

FIG. 6 represents the preferred embodiment of the invention.

FIGS. 7A to 7H are curves representing on the same time scale:

In the case of FIG. 7A, the form of a wave to be demodulated present at the input of the limiter circuit.

In the case of FIGS. 7B and 7C, the form respectively of a first and of a second pulse train present at the output of the limiter circuit.

In the case of FIGS. 7D and 7E, the form of the signal present at the output of two circuits according to the invention as embodied according to the first embodiment.

In the case of FIGS. 7F and 7G, the form of the signal present at the output of two circuits according to the invention as embodied according to the advantageous embodiment.

In the case of FIG. 7H, the form of the signal present at the output of the circuit carrying out asymmetric integration according to the preferred embodiment of the invention.

For a first approach to the understanding of the principle of operation of the demodulator according to the invention, this will be explained in conjunction with FIGS. 2 and 3A to 3C.

Figure 1:
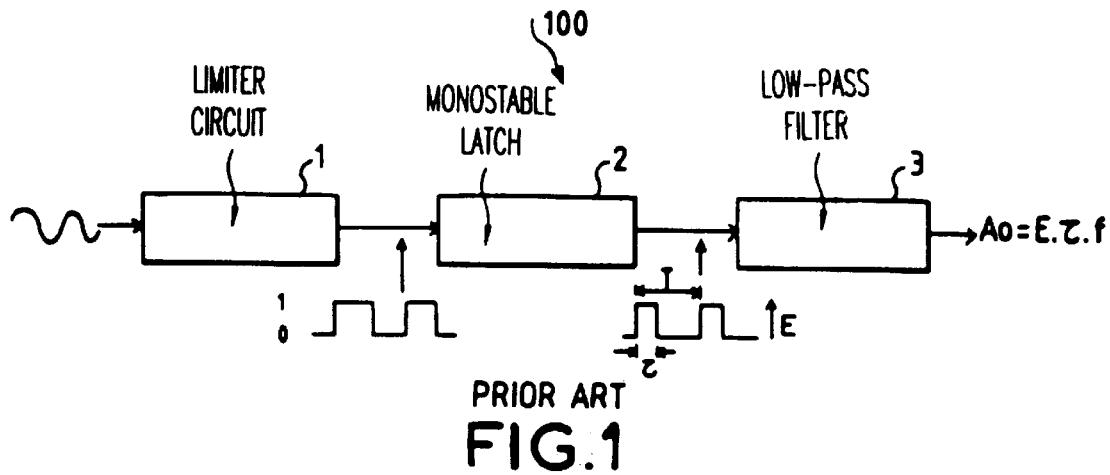
FIG. 1, already described, represents a circuit for demodulating a frequency-modulated signal according to a known prior art.
Figure 2:
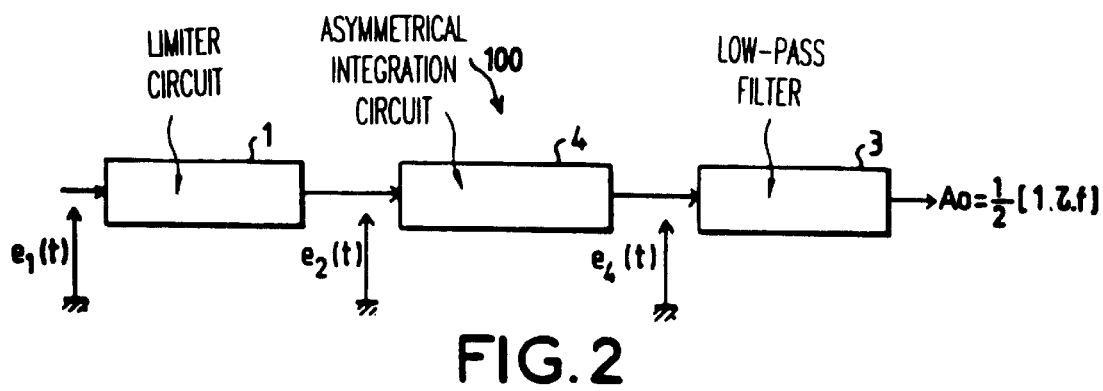
FIG. 2 represents a diagram explaining how the invention is inserted into a demodulator and is intended to describe the invention in its most general form.

FIG. 2 represents diagramatically the location of the circuit according to the invention with respect to the circuits of the prior art.

The asymmetrical integrator circuit 4 according to the invention is situated, like for example the monostable latch 2 of the prior art, between a limiter circuit 1 and a low-pass filter 3. The limiter circuit 1 receives as input a signal $e_1(t)$, represented in FIG. 3A, which is the frequency-modulated wave which it is wished to demodulate. On the basis of this wave and in a known manner the limiter circuit produces a signal $e_2(t)$, represented in FIG. 3B, formed by a succession of low and high levels. A rising edge is produced each time the signal $e_1(t)$ passes through 0 with a positive derivative. A falling edge is produced each time the signal $e_1(t)$ passes through 0 with a negative derivative.

Figure 3A:
FIGS. 3A to 3C are curves representing the amplitude of various signals on the same time scale.
Figure 3B:
Figure 3C:
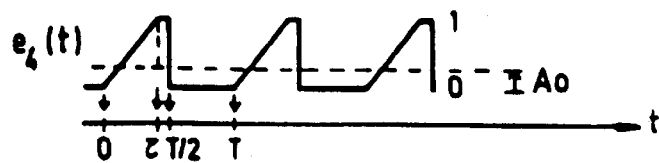

According to an embodiment of the invention, the asymmetric integrator will produce a signal $e_4(t)$ represented in FIG. 3C, which has the characteristic that its instantaneous mean value is proportional to the absolute value of the instantaneous frequency of the signal $e_1(t)$ to be demodulated. It is this signal which as in the prior art, will be introduced into the low-pass filter 3 to produce the signal $A_0$. An example of an embodiment of an integrator circuit carrying out the asymmetric integration according to the formula:

$$A_0 = \frac{E}{T}\left[\int_0^{\tau 0} \frac{t}{\tau} dt + \int_\tau^{T/2} dt\right],$$

will be described hereafter in conjunction with FIGS. 4 and 5A and 5E.

In FIG. 4, the example of an embodiment of an integrator circuit 4 is again represented between a limiter circuit 1 and a low-pass filter 3.

FIGS. 5A and 5E represent on the same time scale the forms of signals present at various points of the circuit represented in FIG. 4. The signals $e_1(t)$ and $e_2(t)$, present at the input and output of the limiter circuit 1, form the object of FIGS. 5A and 5B respectively. They have been reproduced in FIGS. 5A to 5E so as to show up the synchronies of these signals with the various signals which appear in the asymmetric integrator 4.

The circuit represented in FIG. 4 includes a modified differential structure 30 formed, for example, by two transistors $Q_1$ 6 and $Q_2$ 7. These transistors each include a collector 8 and 9 respectively, a base 10 and 11 respectively, and an emitter 12 and 13 respectively.

The description which follows is for NPN transistors, but those skilled in the art will have no difficulty in adapting the circuit to the use of PNP transistors.

The two inputs of the differential structure 30 consist of the links 14 and 15 to the bases 10 and 11 of each of the transistors $Q_1$ 6 and $Q_2$ 7. The first link 14 of the transistor $Q_1$ 6 receives the signal $e_2(t)$ originating from the limiter 1. The second link 15 of the modified differential structure 30 receives the output from a unit-gain separator stage 16 whose input 17 is connected on the one hand to a current generator 18 and to a terminal 19 of a capacitance 20 and on the other hand to the terminal 9 of $Q_2$ 7. It is by virtue of the presence of the elements 16, 18 and 20 that the differential structure 30, which in the strict sense includes only the transistors $Q_1$ 6 and $Q_2$ 7, has been referred to as a modified differential structure. The capacitance 20 may have no physical existence, in particular at high frequency, since it may be a stray capacitance, that is to say a capacitance formed by circuit elements between themselves. The capacitance 20 preferably forms part of the application-specific integrated circuit which includes the circuit according to the invention. It may however be external to this circuit. The current generator 18 delivers a current $I_1$ heading for the common link-up point B of the terminal 19 of the capacitance 20, of the current generator 18, and of the input 17 of the unit-gain separator stage 16. The output 21 of the modified differential structure 30 consists of a point 21 common to the emitters 12 and 13 of the transistors $Q_1$ 6 and $Q_2$ 7. A current generator 22 is connected to the common point 21. It delivers a current of strength $I_2$ which is double that $I_1$ from the current generator 18. The modified differential structure 30 is composed of the elements labelled 6 to 22.

The operation of the modified differential structure 30 will be explained hereafter. The link 14 of this modified differential structure 30 is equivalent to the input $e^{(+)}$ of a loop system of which the link 15 constitutes the input $e^{(-)}$. Of course, in such a system the input $e^{(-)}$ tends to faithfully copy—if not hindered in any way—the signal applied to the link $e^{(+)}$ 14. Let us assume that at an instant to-$\epsilon$, the link $e^{(-)}$ 15 exactly copies the potential applied to the link $e^{(+)}$ 14. Under such a supposition, the current $I_2=2I_1$ from the current generator 22 is apportioned equitably to the transistors $Q_1$ 6 and $Q_2$ 7.

The collector 9 current $I_{(c)}$ of the transistor $Q_2$ 7 is equal to the emitter current $I_E$ of this same transistor. Thus, the current $I_1$ of the current generator 18 is "absorbed" by the collector 9 of the transistor $Q_2$ 7.

It is assumed that at $t_0$ there appears a positive transition $\Delta V$ in the form of a rising edge of the signal $e_2(t)$ at the output of the limiter circuit 1. This transition appears on the link $e^{(+)}$ 14 of the modified differential structure 30. This transition is copied in a known manner on the emitter 12 of the transistor $Q_1$ 6, the latter being nothing other than a follower stage. By virtue of the presence of the capacitance 20, the link $e^{(-)}$ 15 cannot instantaneously copy the potential applied to the link $e^{(+)}$ 14. The link $e^{(-)}$ 15 remains momentarily at the low level which it had before $t_0$. The transistor $Q_2$ 7 is turned off under the effect of the positive transition $\Delta V$ applied between its emitter 13 and its base 11.

With the transistor $Q_2$ 7 turned off, the current $I_2=2I_1$ is wholly diverted to the emitter 12 of the transistor $Q_1$ 6. The value of the collector 9 current $I_{(c)}$ of the transistor $Q_2$ 7 being zero, the current $I_1$ is "injected" into the capacitance 20, the latter charging up linearly to a positive voltage. The variation in voltage developed across the terminals of the capacitance 20 is transmitted to the link $e^{(-)}$ 15 via the unit-gain separator stage 16.

After a time $$\tau = \frac{C\Delta V}{I_1}, \text{ with } \tau \leq \frac{T\min}{2} = \frac{1}{2f\max},$$

the link $e^{(-)}$ 15 of the modified differential structure 30 copies the potential applied to the link $e^{(+)}$ 14. The current $I_2I_1$ is again apportioned symmetrically to the transistors $Q_1$ 6 and $Q_2$ 7, thereby zeroing out the charging current of the capacitance 20.

At the instant $$t_0 + \frac{T}{2},$$

a negative transition $\Delta V$, corresponding to the falling edge of the signal $e_2(t)$, is applied to the link $e^{(+)}$ 14 of the modified differential structure 30. By virtue of the type of transistor used and of the phenomenon of copying the voltage stored by the capacitance 20 onto the emitter 13 of the transistor $Q_2$ 7 via the unit-gain separator stage 16, the transistor $Q_1$ 6 is turned off. The current $I_2=2I_1$ from the current generator 22 is wholly diverted to the emitter 13 of the transistor $Q_2$ 7. The value of the collector 9 current $I_c$ of the transistor $Q_2$ 7 is substantially equal to the value $l_e$ of the emitter current of this same transistor. With the current generator 18 merely delivering a current $I_1$, this implies that the extra current is supplied by a current equal to $l_1$, likewise originating from the capacitance 20. The capacitance 20 discharges with a current $I_1$ to negative voltages. The variation in voltage across the terminals of the capacitance 20 is faithfully transmitted on the one hand to the base 11 of the transistor $Q_2$ 7 by the link $e^{(-)}$ 15 and on the other hand to the emitter 13 of the transistor $Q_2$ 7.

After a time $$\tau = C\frac{\Delta V}{I_1},$$

the link $e^{(-)}$ 15 reaches the potential applied to the link $e^{(+)}$ 14. The negative-feedback loop becomes operational again. The modified differential structure 30 restabilizes at equilibrium. The value of the collector 9 current $I_c$ of the transistor $Q_2$ 7 becomes equal to $l_1$. The discharge current of the capacitance 20 vanishes. The cycle is complete.

The value of the voltage $e_3(t)$ available respectively between earth and the connection point B 19 common to the capacitance 20, to the current generator 18 and to the input 17 of the separator stage 16 is represented in FIG. 5C. That of the voltage $e_4(t)$ present between earth and the output 21 of the modified differential structure 30 is represented in FIG. 5D.

The curve representing $e_3(t)$ includes a linear rise for a time τ equal to the charging time of the capacitance 20, a plateau for the time T/2–τ corresponding to the time during which the modified differential structure 30 is copying the signal present at the link $e^{(+)}$ 14 on to its link $e^{(-)}$ 15. Lastly, it falls linearly during the time τ corresponding to the discharge time of the capacitance 20 under a current equal to $l_1$. Thus, the constant τ is adjusted by the values of $l_1$ and of C.

Apart from the sign, the law of variation of the signal $e_4(t)$ available on the emitters 12 and 13 of the transistors $Q_1$-6 and $Q_2$-7 is strictly identical to that of the signal represented in FIG. 3C to describe the proposed frequency demodulation principle. The output 21 carrying this signal is, as in the prior art, connected to the input of the low-pass filter 3 via a pathway 23 represented by dashes.

In an advantageous variant embodiment, the signal $e_4(t)$ is not applied directly to the low-pass filter 3. It is applied thereto by way of a current switch 24.

The function of the current switch 24 is to convert the signal $e_4(t)$ present at the output 21 of the emitters 12 and 13 into a pulsed signal with square pulses, filtering of which will give the value $A_0$. The benefit of this conversion is twofold. On the one hand, it makes it possible to eliminate a negative dc offset affecting the signal $e_4(t)$. This offset increases the amplitude of the dc signal processed by the low-pass filter and therefore makes the processing more difficult without any advantage otherwise. On the other hand, it makes it possible in passing to evade the variations in the amplitude E of the useful part of the signal $e_4(t)$. These variations may for example be due to temperature drifting. An example of an embodiment and the mode of operation of the current switch 24 will be described hereafter in conjunction with FIG. 4.

The signal $e_4(t)$ is applied to an input of a current switch 24, for example having a differential structure which includes two transistors $Q_3$ 25 and $Q_4$ 26 whose emitters 27 and 28 are respectively connected one to the other. The common connection of the emitters 27 and 28 is connected to a current source 29 delivering a current $I_3$.

The base 31 of the transistor $Q_3$ 25 receives the signal $e_4(t)$. The base 32 of the transistor $Q_4$ 26 is connected to a reference voltage source $V_{ref}$ whose value should be greater than the low level of the signal $e_4(t)$ and less than the high level. The collector 33 of the transistor $Q_3$ 25 is linked for example to earth. The collector 34 of the transistor $Q_4$ 26 is linked to the low-pass filter 3.

The manner of operation is as follows. So long as the voltage applied to the base of the transistor $Q_3$ 25 is less than the voltage $V_{ref}$, the current $I_3$ is switched to the low-pass filter 3 by the transistor $Q_4$ 26 since the transistor $Q_3$ 25 is off. When the voltage applied to the base 31 of the transistor $Q_3$ 25 becomes greater than the reference voltage $V_{ref}$, the transistor $Q_3$ 25 conducts. The current $I_3$ is switched into the transistor $Q_3$ 25. The transistor $Q_4$ 26 is off.

Thus, current pulses characterized by an amplitude equal to $l_3$ and a duration equal to $$\frac{T}{2} - \tau_1$$

are injected into the low-pass filter 3, where $\tau_1$ is the time taken by the signal $e_4(t)$ to move from its high level to the value $V_{ref}$.

It may be demonstrated that the mean value of the current pulses thus produced is proportional to the mean value of the signal $e_4(t)$, and hence to the value of the frequency to be demodulated. The signal $e_5(t)$ present at the input of the low-pass filter 3 fed by the collector 34 of the transistor $Q_4$ 26 is represented in FIG. 5E. This is a pulse train. Each pulse of the train has a duration equal to $$\frac{T}{2} - \tau_1.$$

Their frequency is proportional to the instantaneous frequency of the signal to be demodulated.

The preferred embodiment of the invention will now be described and its manner of operation explained with reference to FIGS. 6 and 7A to 7H.

FIG. 6 represents an example of an electrical diagram of a circuit 60 according to the invention. FIGS. 7A to 7H represent on the same timescale the form of signals present at various points of the electrical circuit represented in FIG. 6.

The circuit represented in FIG. 6, like that represented in FIG. 4, is a circuit receiving a signal $e_2(t)$ output by a limiter 1' receiving a signal to be demodulated $e_1(t)$. The limiter 1' to be employed with the circuit 60 has two symmetric outputs, a first 14' and a second 14". The signals present on the first output are positive pulses $e'_2(t)$, like those described earlier in conjunction with FIG. 3B. The signals $e''_2(t)$ present on the second output 14" are pulses which are symmetric to those of the signal $e'_2(t)$. By "symmetric" is meant that the pulses of the signal $e''_2(t)$ have their points of low value while the signal $e'_2(t)$ has its points of high value. It is not important for the differences between the low value and the high value of the signals $e'_2(t)$ and $e''_2(t)$ to be equal to one another. It happens that in the illustrative embodiment described here, this is the case. The signals $e_1(t)$, $e'_2(t)$ and $e''_2(t)$ form the subject of FIGS. 7A to 7C respectively.

The output 34 of the circuit 60 is, as in the example described in relation to FIG. 4, connected to a low-pass filter 3.

The circuit 60 will now be described. This circuit comprises two modified differential structures 30' and 30". The modified differential structures 30' and 30" include the same elements linked in the same fashion. These elements are the same ones and are linked together in the same fashion as the circuit described in relation to FIG. 4 and bearing the reference 30. In FIG. 6, the same reference numerals as those used to describe the modified differential structure 30 of FIG. 4 have been enlisted for the modified differential structures 30' and 30", with superscripts ' and ". The modified differential structure 30' of FIG. 6 occupies the left part of the figure. The modified differential structure 30" occupies the right part of FIG. 6.

The modified differential structure 30' is connected to the first output 14' of the limiter 1'. The modified differential structure 30" is connected to the second output 14" of the limiter 1'. The outputs 31' and 31" of the modified differential structures 30' and 30" could be linked together and feed the low-pass filter 3. Advantageously, each of the outputs 31' and 31" is linked to a current switch 24' and 24" respectively.

Each of the current switches 24' and 24" includes the same elements linked together in the same fashion as those of the current switch 24 described in relation to FIG. 4. Consequently, the elements of the current switches 24' and 24" bear the same reference numerals as those of their counterpart in FIG. 4.

Each of the outputs 31' and 31" of the modified differential structures 30' and 30" feeds an input of the current switches 24' and 24". The collectors 34' and 34" of the current switches 24' and 24" are linked together and feed the low-pass filter 3.

The detailed operation and detailed description of the modified differential structures 30' and 30" and current switches 24' and 24" making up the circuit 60 will not be repeated. The reader is referred to the description of the modified differential structure 30 and of the current switch 24 given in conjunction with FIG. 4.

The benefit of this double structure will now be explained in conjunction with FIGS. 7D to 7H. FIGS. 7D and 7E respectively represent the form of the signals at the output 31' of the modified differential structure 30' and at the output 31" of the modified differential structure 30".

The symmetry of the signals $e'_2(t)$ and $e''_2(t)$ at the input 14' and 14" of each of these circuits brings about an offset of half a period in the form of the signals $e'_4(t)$ and $e''_4(t)$ present at the outputs 31' and 31" of the modified differential structures 30' and 30". This offset is apparent on comparing the curves represented in FIGS. 7D and 7E respectively.

Owing to this offset, there also appears an offset equal to half a period of the modulated frequency $e_1(t)$ present at the input of the circuit 60, between the collectors 34' and 34" of the current switches 24' and 24". The signals $e'_5(t)$ and $e''_5(t)$ present in the collectors 34' and 34" of the current switches 24' and 24" are also offset in time the one with respect to the other by half a period. They are represented in FIGS. 7F and 7G.

The signal in the collector 34 of the double structure 24' and 24" is made up of the addition of signals $e'_5(t)$ and $e''_5(t)$ present in the collectors 34' and 34". Thus, pulses represented in FIG. 7H are obtained at the output of the circuit 60, their frequency being double the instantaneous frequency present at the input of the circuit 60. The benefit of this doubling is known to those skilled in the art. It will be recalled below.

Not only does it increase the amplitude of the signal detected at the output of the low-pass circuit 3 by a factor of 2, but also, and more importantly, it doubles the base frequency and hence the frequency of the first harmonic of this doubled frequency. This will make it easier to construct the low-pass filter 3.

The circuit according to the invention has the advantage of being able to be embodied entirely on a dedicated integrated circuit. However, in a few cases, in particular if the value of the capacitance 20 is large, it may be beneficial when building the circuit to provide terminals for linking to one or more capacitances 20 or 20' or 20".

There will be one capacitance 20 if the circuit is constructed according to the embodiment described in relation to FIG. 4.

There will be two capacitances 20', 20" if the circuit is constructed according to the embodiment described in relation to FIG. 6. In this case, the integrated circuit and the capacitance or capacitances will together form the circuit according to the invention.

We claim:

1. Circuit of a demodulator of a frequency-modulated signal, the instantaneous frequency of the signal varying between a minimum frequency fmin and a maximum frequency fmax, the circuit having at least one input receiving an input signal formed by a train of pulses, each pulse having a rising edge and a falling edge, the height of a pulse of the input signal being equal to the difference between the level of the signal before a rising or falling edge and its level after this rising or falling edge, the circuit producing on an output of the circuit a signal whose instantaneous integral over time has a value proportional to the instantaneous frequency of the pulses making up the input signal, the circuit being characterized in that it carries out integration over time of the height of at least one of the edges of each pulse of the input signal of the circuit, the time of integration of the height of each integrated edge being a time $\tau$ at most equal to 1/(2 fmax).

2. Circuit according to claim 1 wherein it includes a capacitance, the charging of which at constant current for the time $\tau$ effects the integration of the integrated edge.

3. Circuit according to claim 2, characterized in that it includes at least one modified differential structure, the structure including at least two active elements mounted in symmetrical fashion, each active element having at least one connection, one of the connections of an active element receiving the output from a unit-gain separator stage having an input, this input being connected to a point B to which are also connected a terminal of the integration capacitance and a constant-current generator.

4. Circuit according to claim 3, wherein the two active elements are two transistors, a first and a second, each transistor having an emitter, a collector and a base.

5. Circuit according to claim 4, wherein the connection receiving the output from the unit-gain separator stage is the base of one of the transistors.

6. Circuit according to claim 4, wherein the emitters of each of the transistors are connected together at a point to which a current generator is linked.

7. Circuit according to claim 5, wherein the emitters of each of the transistors are connected together at a point to which a current generator is linked.

8. Circuit according to claim 6, wherein the common point of connection of the emitters of each of the emitters constitutes the output of the circuit.

9. Circuit according to claim 7, wherein the common point of connection of the emitters of each of the emitters constitutes the output of the circuit.

10. Circuit according to claim 6, wherein the circuit furthermore includes a current switch having an input and an output, the input of the current switch being connected to the point common to the emitters of the transistors and the output of the current switch constituting the output of the circuit.

11. Circuit according to claim 7, wherein the circuit furthermore includes a current switch having an input and an output, the input of the current switch being connected to the point common to the emitters of the transistors and the output of the current switch constituting the output of the circuit.

12. Circuit according to claim 10, wherein the current switch includes a differential structure composed of two active elements wired in symmetrical fashion.

13. Circuit according to claim 11, wherein the current switch includes a differential structure composed of two active elements wired in symmetrical fashion.

14. Circuit according to claim 12, wherein the two active elements of the current switch are two transistors each having a base, a collector, and an emitter.

15. Circuit according to claim 13, wherein the two active elements of the current switch are two transistors each having a base, a collector, and an emitter.

16. Circuit according to claim 14, wherein the emitters of the transistors of the current switch are linked together, their common connection being linked to a current generator.

17. Circuit according to claim 15, wherein the emitters of the transistors of the current switch are linked together, their common connection being linked to a current generator.

18. Circuit according to claim 16, wherein the input of the current switch is made on the base of one of the transistors, and the output on the collector of the other transistor the base of this other transistor receiving a reference voltage.

19. Circuit according to claim 17, wherein the input of the current switch is made on the base of one of the transistors, and the output on the collector of the other transistor the base of this other transistor receiving a reference voltage.

20. Circuit which comprises two differential structures, according to claim, 3 each of the two structures having the same elements as the other, wired up in the same fashion, each structure having an input and the outputs of each of the structures being linked to one another.

21. Circuit according to claim 10, wherein it includes two circuits, each of the two circuits having the same elements as the other wired up in the same fashion, each circuit having an input, the outputs of each of the circuits being linked one to the other.

22. Integrated circuit including a circuit according to claim 1.

23. Integrated circuit and capacitance together forming a circuit according to claim 1.

24. Demodulator of a frequency-modulated signal having a limiter circuit furnished with an input receiving the frequency-modulated signal and producing on at least one output (14, 14', 14") a train of pulses whose frequency of occurrence is a function of the instantaneous frequency of the input signal, a low-pass filter having an output and an input, the output carrying a signal representing the modulation carried by the frequency-modulated signal, the demodulator being characterized in that it includes a circuit according to claim 1, this circuit receiving the pulse train at the output (14, 14', 14") of the limiter circuit and feeding the low-pass filter.

25. Demodulator according to claim 24 that is embodied on an integrated circuit.

26. Demodulator, characterized in that it is embodied in part on an integrated circuit, this part and at least one capacitance connected to this part together forming a demodulator according to claim 24.

* * * * *